(12) United States Patent
Mark et al.

(10) Patent No.: US 6,788,095 B1
(45) Date of Patent: Sep. 7, 2004

(54) METHOD FOR GROSS INPUT LEAKAGE FUNCTIONAL TEST AT WAFER SORT

(75) Inventors: David Mark, San Jose, CA (US); Randy J. Simmons, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/355,563

(22) Filed: Jan. 31, 2003

(51) Int. Cl.$^7$ .............................................. G01R 31/02
(52) U.S. Cl. ..................... 324/765; 324/158.1; 324/763
(58) Field of Search ................... 324/763, 765, 324/158.1, 754, 73.1, 537; 714/733, 736, 724, 734; 702/119; 327/198, 143, 18, 20

(56) References Cited

U.S. PATENT DOCUMENTS

| | | | | |
|---|---|---|---|---|
| 5,198,707 A | * | 3/1993 | Nicolai .................. | 365/189.03 |
| 6,262,585 B1 | * | 7/2001 | Frodsham et al. .......... | 324/763 |
| 6,313,656 B1 | * | 11/2001 | Schaffroth et al. .......... | 324/763 |
| 6,348,810 B1 | * | 2/2002 | Yanagawa et al. .......... | 324/765 |

OTHER PUBLICATIONS

Xilinx, Inc., "Virtex™–II Platform FPGAs: DC and Switching Characteristics," Advanced Product Specification, Dec. 6, 2002, p. 2, DS031–3 (v2.4), available from Xilinx, Inc., 2100 Logic Drive, San Jose, CA., 95124.

* cited by examiner

*Primary Examiner*—David A. Zarneke
*Assistant Examiner*—Jimmy Nguyen
(74) *Attorney, Agent, or Firm*—Justin Liu

(57) ABSTRACT

A method and test configuration for performing a gross input leakage test at wafer sort is described. The method uses a pullup and pulldown on an I/O pad to inject current at the I/O pad, and, based on the resulting voltage, determines if the leakage current is excessive. The method allows an input leakage test to be performed at wafer sort without a precision measurement unit and without direct access to the I/O pad to be tested.

17 Claims, 4 Drawing Sheets

METHOD FOR GROSS INPUT LEAKAGE FUNCTIONAL TEST AT WAFER SORT

FIELD OF THE INVENTION

The invention relates to semiconductor testing, and, more particularly, to a method for wafer sort testing.

BACKGROUND OF THE INVENTION

Integrated circuits (ICs) are tested and characterized at different points during the process by which they are fabricated and assembled. The test and characterization data can be used to grade the performance of the ICs, and to eliminate ICs that fail to meet performance standards set by a manufacturer.

One set of tests is performed at "wafer sort." At this point, the ICs are fully formed, but have not yet been "diced" or separated into individual chips. ICs are typically produced on silicon wafers, each wafer having many ICs. During the wafer sort, a probe card is used to provide test signals to the IC and receive test results from the IC. The probe card touches down on certain input/output (I/O) bonding pads and sends and receives signals through those contact points. The test results are analyzed, and the ICs that fail to meet the required performance standards are discarded when the wafer is diced.

After the ICs are cut from the wafer and separated from each other, and after the ICs that failed the wafer sort test have been eliminated, the remaining ICs are assembled into their packages. The assembly process can involve attaching bond wires or solder bumps to the I/O bonding pads of the IC, connecting the IC to a substrate, and enclosing the IC in a protective package. Once assembly is complete, another set of tests, commonly referred to as "final test," is performed. At final test, automated test equipment (ATE) tests the performance of the fully assembled ICs, and, as with the wafer sort test, ICs that fail to meet the performance standards set by a manufacturer are discarded.

One common parameter that is tested prior to shipping an IC to a customer is the input leakage current. Input leakage current refers to the static current drawn at an input. Normally, this measurement is made using a precision measurement unit (PMU). If any I/O on an IC shows input leakage current in excess of the maximum set by the manufacturer, the IC is discarded. For example, the Virtex™-II FPGA (field programmable gate array) manufactured by Xilinx®, Inc. of San Jose, Calif. has a maximum absolute value input leakage current of 10 $\mu$A, as specified on its data sheet, "Virtex™-II Platform FPGAs: DC and Switching Characteristics," Dec. 6, 2002, page 2, DS031-3 (v2.4). Input leakage can be measured by connecting a PMU to an I/O pad of an IC, either at wafer sort or at final test. In order for the PMU to make the current measurement, the PMU must have access to each I/O pad to be tested.

In some applications, the probe card used at wafer sort does not have access to every I/O pad of an IC. For example, the tests to be performed at wafer sort may only require access to a subset of the I/O pads. As another example, not all of the final, packaged ICs will make use of every I/O pad on the IC, so it can be more cost effective to touch down only on the I/O pads used by every package configuration. In another example, a manufacturer can choose to run wafer sort tests only through certain I/O pads, since testing costs (such as the costs in aligning and maintaining probe cards) increase as the number of accessed I/O pads increases. However, if only certain I/O pads are accessed, the I/O pads that are not accessed by the tester cannot be tested by a PMU, and the leakage current for those I/O pads cannot be determined.

In cases where not every I/O pad is tested at wafer sort, a manufacturer would perform the input leakage test at final test. At final test, all of the I/O pads that are used by an IC in a particular package configuration are connected to package pins, and a manufacturer will typically test all such connected package pins to ensure complete functionality. Testing input leakage at final test, however, increases the cost to the manufacturer, since the manufacturer incurs the assembly costs for ICs that fail to meet the input leakage specification at final test and are rejected and discarded. Had the IC been tested and rejected at the wafer sort test, the manufacturer could have saved at least the cost of assembly.

Therefore, a need exists for a cost-effective method for performing an input leakage test, wherein such test can be performed early in the fabrication process, such as at wafer sort, and without having direct access to the I/O pads to be tested.

SUMMARY OF THE INVENTION

An IC in accordance with the present invention has a resistive element coupled between a voltage reference node, usually power or ground, and an I/O pad. The resistive element is used to inject current to the I/O pad and a detector is used to sense the voltage level of the I/O pad. The test result can be retrieved through an interface such as JTAG. In one embodiment, the resistive element is a transistor that can be selectively enabled by a memory bit.

A method in accordance with the present invention comprises enabling a resistive element coupled between an I/O pad and a voltage reference node, such as power or ground, measuring or detecting a resulting voltage level at the I/O pad, and, based on that result, determining if the input leakage current for that I/O pad exceeds a preset threshold. If so, the IC can be rejected and discarded at the wafer sort test.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of systems, and, while the present invention is not so limited, an appreciation of the present invention is presented by way of specific examples. In the following description, numerous specific details are set forth to provide a more thorough understanding of the present invention. However, it will be apparent to one ordinarily skilled in the art that the present invention can be practiced without these specific details.

Figure 1A:
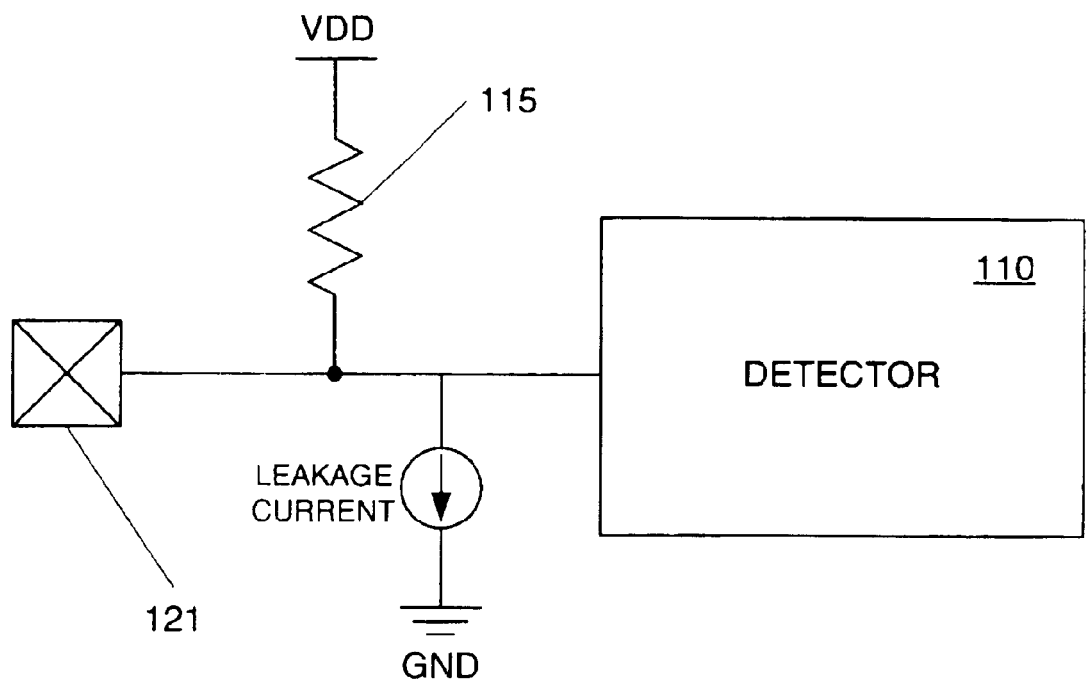
FIGS. 1A and 1B show block diagrams of test configurations for measuring leakage to ground and to power, respectively.

FIG. 1A shows a test configuration for measuring the input leakage at an I/O pad 121. I/O pad 121 is connected through a resistive element 115 to power node VDD. This configuration has the effect of injecting current at I/O pad 121. A detector 110 is also connected to I/O pad 121. Detector 110 can sense the resulting voltage level of I/O pad 121. As one of ordinary skill in the art will readily understand, the leakage current to ground can be determined based on the voltage drop across resistive element 115 and on a known relationship between that voltage drop and current for that resistive element. By placing the resistive element and the detector on the IC itself, there is no need for a precision measurement unit (PMU) to measure input leakage in this test configuration. This means, for instance, the automated test equipment (ATE) can test input leakage without direct access to each I/O pad to be tested.

Figure 1B:
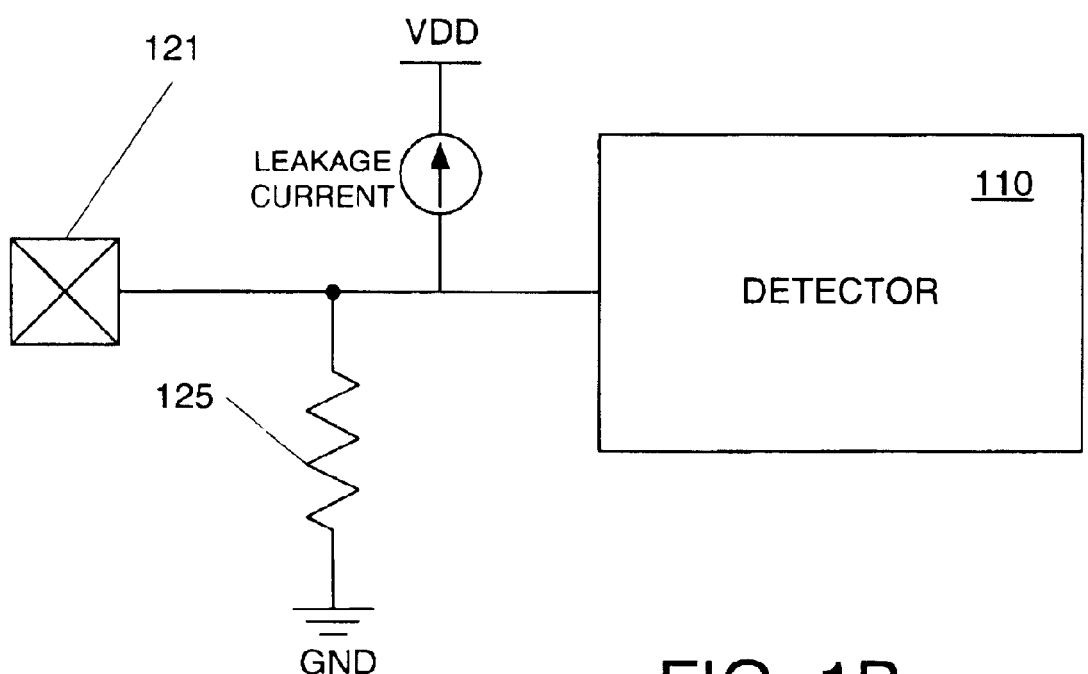

FIG. 1B shows a test configuration similar to the configuration shown in FIG. 1A. Here, a resistive element 125 is connected between I/O pad 121 and the ground node GND, and therefore allows the leakage current to the power node VDD to be determined. Again, detector 110 can measure the voltage level of I/O pad 121. Based on the measured voltage, the voltage drop across resistive element 125, and therefore the input leakage to VDD, can be determined.

Figure 2A:
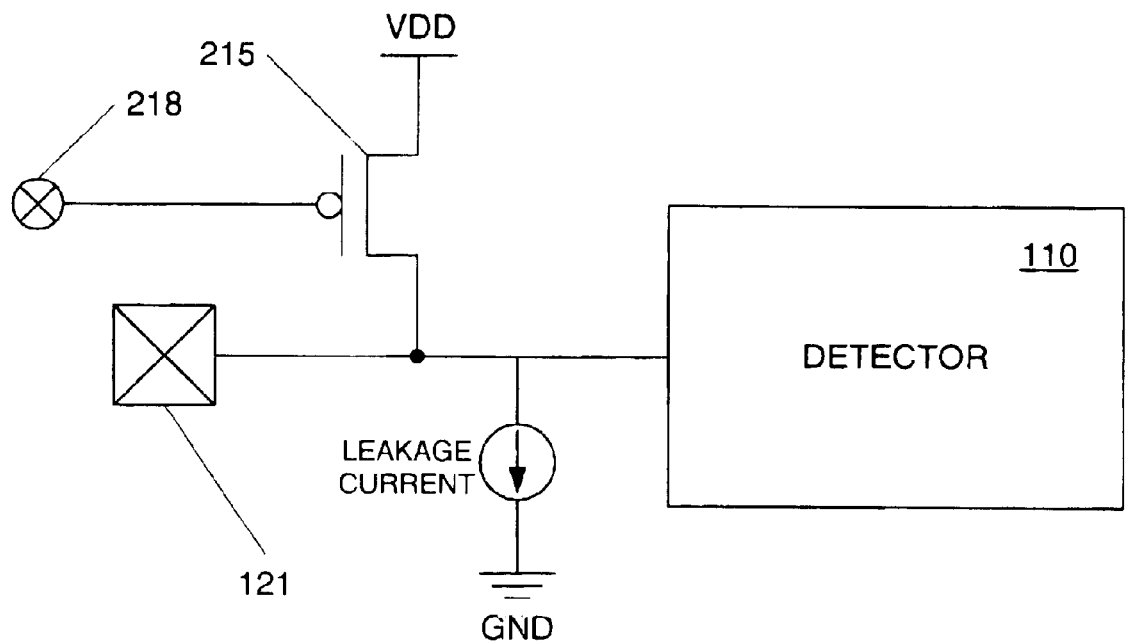
FIGS. 2A and 2B show block diagrams of test configurations for measuring leakage to ground and to power, respectively, using a transistor that can be controlled by a memory bit to produce a resistive element with a variable resistance.
Figure 2B:
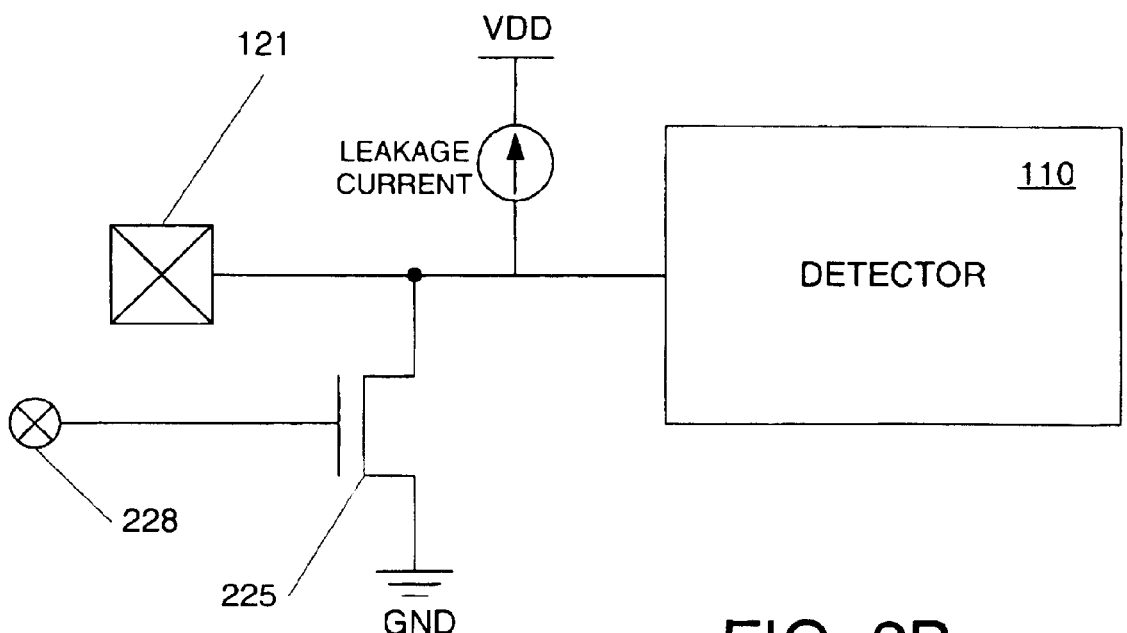

FIGS. 2A and 2B show embodiments of the present invention wherein the resistive elements are transistors. The test configuration shown in FIG. 2A has a transistor 215 connected between VDD and I/O pad 121. As before, the known relationship between the voltage drop across transistor 215 and the current flowing through transistor 215 allows for the leakage current to ground to be determined. In this example, a memory bit 218 is coupled to the gate of transistor 215, which allows for transistor 215 to be selectively enabled. For example, by appropriately configuring memory bit 218, transistor 215 can be enabled for determining the leakage current, and then later disabled for other applications. FIG. 2B shows a similar embodiment with a transistor 225 connected between I/O pad 121 and GND, and allowing for determination of the leakage to VDD. Like transistor 215, transistor 225 can also be selectively enabled by a memory bit 228. In other embodiments, transistors 215 and 225 can be selectively enabled by other circuitry or means (such as a zener diode), as will be known to those of ordinary skill in the art.

A programmable logic device (PLDs) is a well-known type of integrated circuit that has various programmable resources and that can be programmed to perform specified logic functions. Types of PLDs include the field programmable gate array (FPGA) and the complex programmable logic device (CPLD). For all of these programmable logic devices, the functionality of the device is typically controlled by data bits provided to the device for that purpose. These data bits can be stored in volatile memory, in nonvolatile memory, or in any other type of memory cell. Since PLDs already include programmable resources controlled by memory bits, a resistive element coupled between an I/O pad and a voltage reference node that is selectively enabled by a memory bit can be just another programmable resource controlled by memory bits in a PLD. This makes a resistive element particularly convenient to implement in a PLD. In fact, one PLD, the Virtex™-II FPGA, already includes a programmable pullup and pulldown in each I/0 block that can be used as the resistive elements in the present invention. Many other PLDs also already incorporate the same or similar resources in their design. This means that for many PLDs, the present invention can be practiced without any significant additional circuitry.

In one embodiment, detector 110 can be a boundary scan cell. Boundary scan is part of the JTAG (Joint Test Access Group, also known as IEEE 1149.1) standard and is well known to those of ordinary skill in the art. A boundary scan cell includes a storage element, a serial input, and a serial output. The serial input and output are connected to other boundary scan cells on an IC to form a serial chain. SAMPLE/PRELOAD is a JTAG instruction that causes each boundary scan cell to "sample" and store the logical value of a particular node in an IC. This data can then be scanned out of the IC through the serial chain. Using an interface, such as JTAG, to retrieve the detected voltage levels means that an ATE only needs access to that interface, and not each I/O pad to be tested. This can result in a cost savings for a manufacturer, since the cost of testing increases as the number of I/O pads probed increases.

Figure 3:
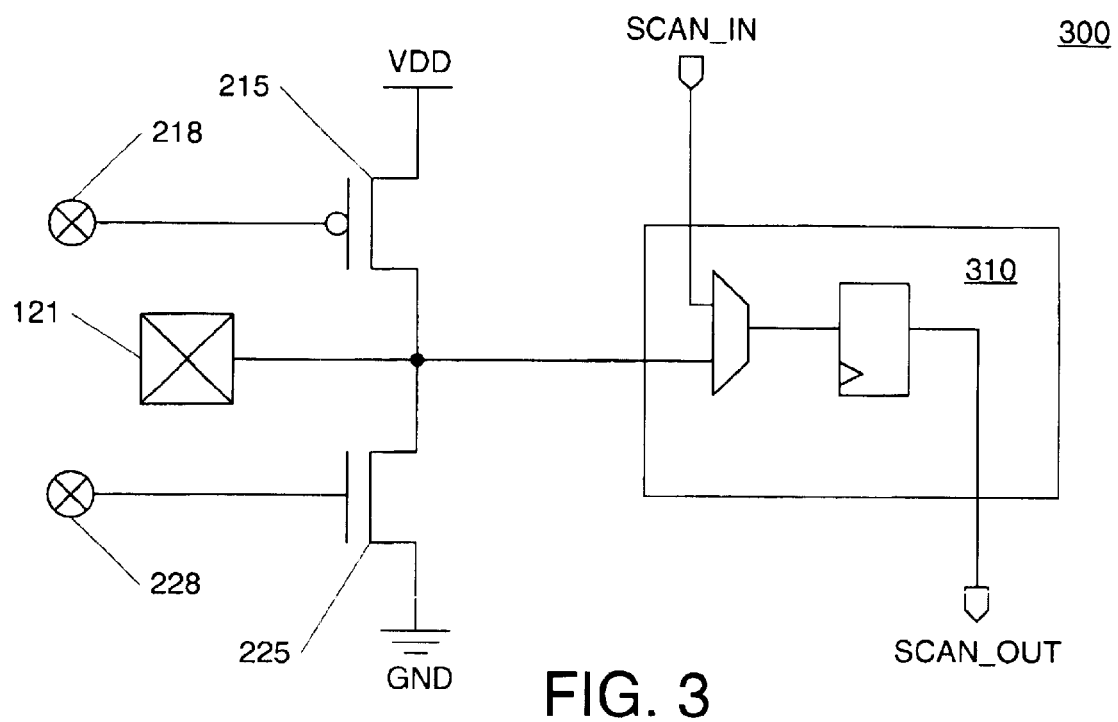
FIG. 3 shows a more detailed block diagram of a test configuration for measuring input leakage.

FIG. 3 shows a block diagram of a circuit 300 including a boundary scan cell 310. As represented in FIG. 3, boundary scan cell 310 includes a storage element that can (by, for example, using a multiplexer) store the value of a particular node (in this example, the value of I/O pad 121) and scan that value out through a serial output SCAN_OUT. Circuit 300 also incorporates both a transistor 215 (coupled between I/O pad 121 and VDD) and a transistor 225 (coupled between I/O pad 121 and GND), each of which can be independently and selectively enabled by appropriately configuring memory bits 218 and 228. For example transistors 215 and 225 can each be enabled in turn in order to test I/O pad 121 for leakage to VDD and GND, respectively.

When the JTAG controller issues the SAMPLE/PRELOAD instruction, a storage element of boundary scan cell 310 will store the logical value of I/O pad 121. If transistor 215 were enabled, a logic high would be expected at I/O pad 121 and would be stored by boundary scan cell 310. If, however, the value received and stored at boundary scan cell 310 is a logic low, then a minimum value for the leakage current to ground can be determined. Similarly, if transistor 225 were enabled, a logic low would be expected, and a logic high value at boundary scan cell 310 means that a minimum leakage current to VDD has been detected.

The minimum leakage current that can be detected can depend on the relationships between voltage and current for transistors 215 and 225, the voltage level of the power supply VDD, and the "trip point" of the input to boundary scan cell 310. As used herein, Strip point, refers to the voltage level at which an input switches from a logic low to a logic high (or vice versa). The trip point for a particular input can be affected by the size of the transistors, the loading at the input, process variations, operational conditions, etc. In one embodiment, a minimum leakage current of approximately 100 $\mu$A can be detected by such an arrangement. For example, in the case where transistor 215 is enabled, if the leakage current to ground exceeds approximately 100 $\mu$A, boundary scan cell 310 detects a logic low (and not the expected logic high). For an IC where a manufacturer has specified a maximum input leakage of 10 $\mu$A, the logic low means the IC has failed the input leakage test and can be discarded (or possibly used in a different application with a different specifications). A similar conclusion can be drawn if transistor 225 is enabled and a logic high is detected. Other levels of minimum leakage current can be detected by adjusting the value of the resistive element used, as will be readily apparent to those of ordinary skill in the art.

Figure 4:
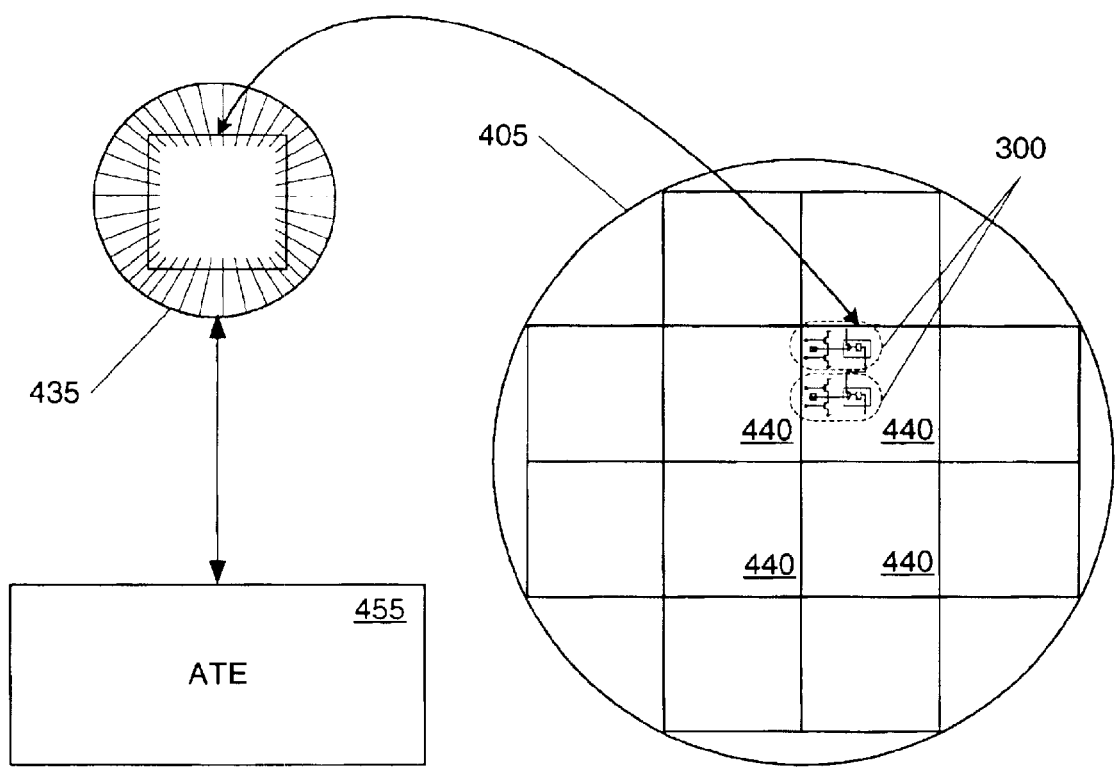
FIG. 4 illustrates a test configuration for performing an input leakage test at wafer sort, including an ATE, a probe card, and a wafer to be tested.
Figure 5:
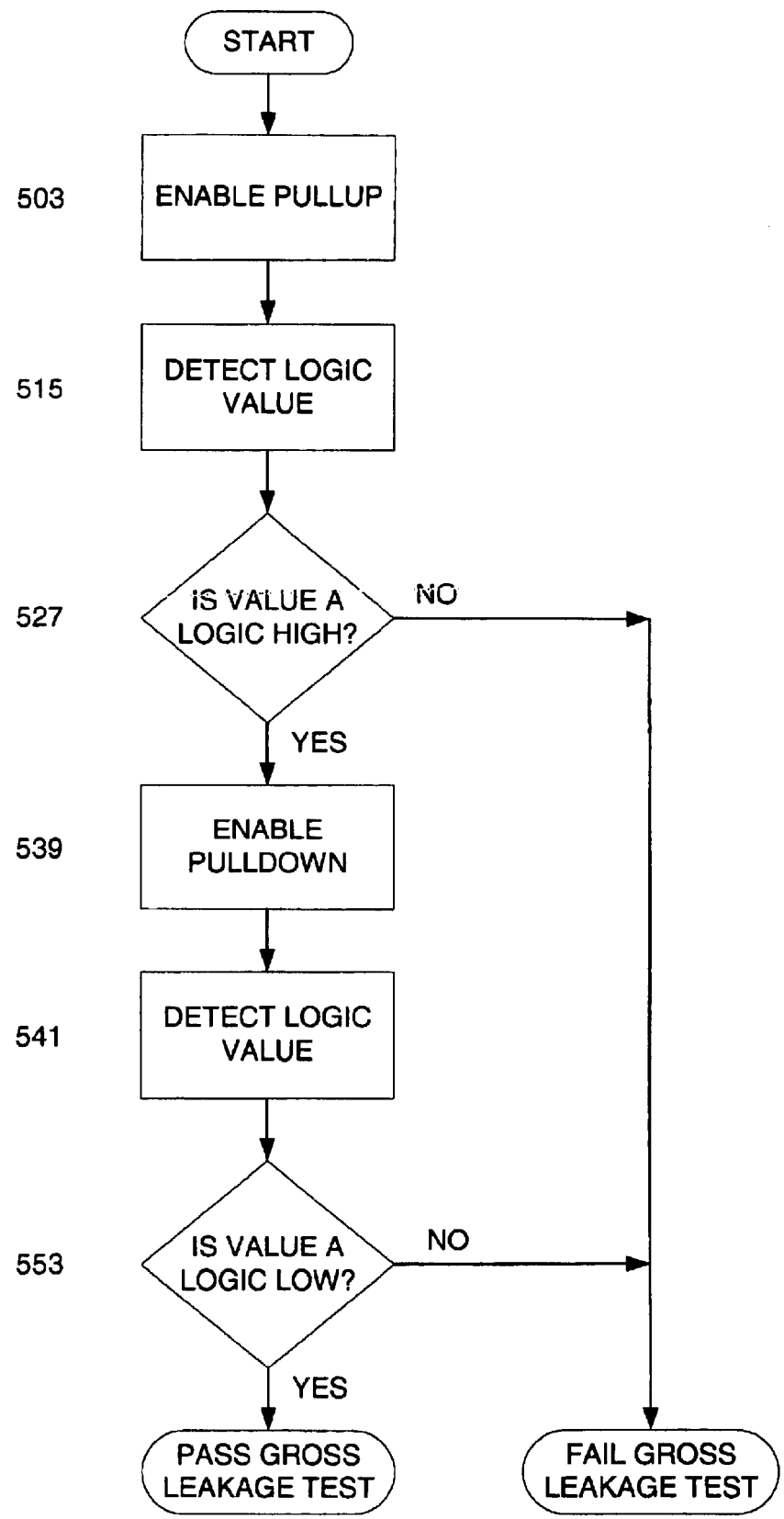
FIG. 5 is a flowchart illustrating a method for performing a gross input leakage test.

FIG. 4 illustrates a test configuration for testing input leakage of ICs at wafer sort, and the flowchart of FIG. 5 sets forth the major steps to be taken. A silicon wafer 405 with several IC "dice" 440 is shown. At wafer sort, ATE 455 is used in conjunction with a probe card 435 to step over each IC die 440 on wafer 405 and test the functionality of each IC die 440. Probe card 435 is carefully positioned over each IC die 440 on the wafer so that certain I/O pads of the IC are touched by probe card 435 and are probed and tested. As explained above, in certain applications, a manufacturer can use a probe card that does not touch down on every I/O pad. Each IC die 440 can include one or more test circuits 300 for testing input leakage on I/O pads that probe card 435 does not touch down on. In some ICs the structure of test circuit 300 is already included and no additional circuitry is required. For example, the Virtex™-II FPGA only needs to be properly configured, including configuring the I/O pads to be tested as input pads, to implement the present invention. In one embodiment, it is sufficient for probe card 435 to touch down only on JTAG control pins (e.g., TDI, TDO, TMS, TCK), and to supply power to the IC being tested, in order to test input leakage. One of the advantages of a JTAG interface for testing is that access to only a small number of pins (e.g., the JTAG control pins) is necessary to control and test the circuit. As stated previously, a reduction in the number of pads probed can mean a reduction in the cost of testing.

Referring to FIG. 5, first, (step 503) each I/O pad to be tested is configured to enable pullup transistor 215. Next, (step 515) boundary scan cell 310 detects the logic value at each I/O pad. This value is scanned out through the serial chain and checked. In one embodiment, the value scanned out is received through probe card 435 and checked by ATE 455. If (step 527) this value is not a logic high, then the IC has failed the gross leakage test. If the value is a logic high, then (step 539) pullup transistor 215 is disabled and pulldown transistor 225 is enabled. Boundary scan cell 310 again detects the logic value (step 541). If (step 553) the value detected is not a logic low, then, again, the IC has failed the gross leakage test. If, however, the value is a logic low, the IC has then successfully passed the gross leakage test.

ICs that pass the gross input leakage test can be diced, assembled, and prepared for final test. At final test, a manufacturer can have access to all of the I/O pads and can measure the input leakage more precisely, for example by using a PMU. It is still possible that ICs that passed the gross leakage test at wafer sort may fail to meet the maximum leakage current specified by a manufacturer at final test due to this increased precision. However, since the manufacturer can eliminate the ICs that fail the gross leakage test at the wafer sort stage (and prior to assembly), the manufacturer can save the costs associated with assembly and final test for those eliminated ICs. Therefore, the present invention allows a manufacturer to perform a gross input leakage test at wafer sort, and eliminate some ICs that exceed the specified maximum leakage current. This results in a reduction in costs, and moreover, for certain ICs (such as the VirtexTH-II FPGA) this reduction in costs does not require any additional circuitry or additional test equipment.

Those having ordinary skill in the relevant arts of the invention will now perceive various modifications and additions that can be made as a result of the disclosure herein. For example, the methods of the present invention can be performed in hardware, software, or any combination thereof, as those terms are currently known in the art. Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is to be limited only by the appended claims and their equivalents.

What is claimed is:

1. A test configuration comprising:
   an integrated circuit to be tested;
   an I/O pad of the integrated circuit;
   a resistive element on the integrated circuit coupled between the I/O pad and a voltage reference node; and
   a detector on the integrated circuit for detecting a logic level of the I/O pad, wherein the resistive element is a first transistor, and wherein the voltage reference node is a power node, further comprising:
   a second transistor coupled between the input pad and a ground node;
   a memory bit coupled to a gate of the first transistor; and
   a memory bit coupled to a gate of the second transistor.

2. A method for testing leakage current between an input pad of an integrated circuit and a voltage reference node, the method comprising:
   enabling a resistive element on the integrated circuit coupled between the input pad and the voltage reference node;
   after enabling the resistive element, detecting a logic value of the input pad; and
   determining the leakage current based on the detected logic value.

3. The method of claim 2 wherein the voltage reference node is a power node, further comprising:
   if the detected logic value is a logic low, rejecting the integrated circuit.

4. The method of claim 3 wherein the resistive element is a first resistive element and wherein the detected logic value is a first detected logic value, further comprising:
   enabling a second resistive element on the integrated circuit coupled between the input pad and a ground node;
   after enabling the second resistive element, detecting a second logic value of the input pad; and
   if the second detected logic value is a logic high, rejecting the integrated circuit.

5. The method of claim 2 further comprising:
   storing the detected logic value in a boundary scan cell of the integrated circuit;
   scanning out the stored logic value.

6. The method of claim 5 further comprising:
   receiving the scanned logic value through a probe card; and
   analyzing the received logic value with automated test equipment at wafer sort.

7. The method of claim 6 further comprising stepping the probe card over each of a plurality of integrated circuits on a wafer.

8. A test configuration comprising:

an integrated circuit to be tested;

an I/O pad of the integrated circuit;

a resistive element on the integrated circuit coupled between the I/O pad and a voltage reference node; and a detector on the integrated circuit for detecting a leakage current of the I/O pad.

9. The test configuration of claim 8 wherein the resistive element is selectively enabled by a memory bit.

10. The test configuration of claim 8 wherein the resistive element is a transistor.

11. The test configuration of claim 10 wherein a gate of the transistor is coupled to a memory bit.

12. The test configuration of claim 8 wherein the voltage reference node is a power node.

13. The test configuration of claim 8 wherein the voltage reference node is a ground node.

14. The test configuration of claim 8 wherein the integrated circuit is one of a plurality of integrated circuits on a wafer.

15. The test configuration of claim 8 wherein the integrated circuit comprises a plurality of I/O pads, the test configuration further comprising:

a probe card coupled to a subset of the plurality of I/O pads; and automated test equipment coupled to the probe card.

16. The test configuration of claim 8 wherein the integrated circuit is a programmable logic device.

17. The test configuration of claim 8 wherein the detector is a boundary scan cell.

* * * * *